United States Patent [19]

Tu et al.

[11] Patent Number: 5,945,851
[45] Date of Patent: Aug. 31, 1999

[54] CURRENT SOURCE APPARATUS WITH BIAS SWITCHES

[75] Inventors: Chien-Cheng Tu; Ching-Ching Chi, both of Hsinchu, Taiwan

[73] Assignee: Industrial Technology Research Institute, Hsinchu, Taiwan

[21] Appl. No.: 08/987,035

[22] Filed: Dec. 9, 1997

[51] Int. Cl.$^6$ ..................................................... H03K 5/22
[52] U.S. Cl. ........................... 327/65; 327/383; 327/103; 327/427; 341/136
[58] Field of Search ................................... 327/108, 415, 327/416, 427, 434, 513, 103, 65, 362, 383; 341/136, 148, 153, 154

[56] References Cited

U.S. PATENT DOCUMENTS

| | | |
|---|---|---|
| 5,008,671 | 4/1991 | Tuthill ........................................ 341/136 |
| 5,148,164 | 9/1992 | Nakamura et al. ...................... 341/136 |
| 5,331,322 | 7/1994 | Cha et al. ................................. 341/136 |
| 5,442,352 | 8/1995 | Jackson .................................... 341/136 |
| 5,689,258 | 11/1997 | Nakamura et al. ...................... 341/136 |
| 5,798,723 | 8/1998 | Fong ........................................ 341/136 |

*Primary Examiner*—Timothy P. Callahan
*Assistant Examiner*—Jung Ho Kim
*Attorney, Agent, or Firm*—Harness, Dickley & Pierce, P.L.C.

[57] ABSTRACT

A current source apparatus with bias switches, applied in digital-to-analog converters, is disclosed. The current compliance and settling time performances can be promoted via improving the structure of the bias circuit and making the MOS transistors operate in the saturation region, without increasing the dimensions of the MOS transistors.

10 Claims, 4 Drawing Sheets

CURRENT SOURCE APPARATUS WITH BIAS SWITCHES

BACKGROUND OF THE INVENTION

1. Field of the Invention

The present invention generally relates to a current source apparatus. More particular, the present invention relates to a current source apparatus with bias switches appropriate for application to digital-to-analog converter. The output compliance and settling time performance of the current source apparatus according to the present invention is improved.

2. Description of the Related Art

Generally, in video digital-to-analog converters (video DAC hereinafter), the on and off states of current cells are controlled via decoding the digital data to supply a specific amount of output current. The output current flows through an output resistor, therefore, the video DAC outputs a corresponding analog output voltage.

FIG. 1 illustrates a block diagram of a DAC circuit. In FIG. 1, the decoder 1 decodes digital data $D_{input}$ and outputs control signals for controlling the on and off states of current cells 2, 3, and 4. The output current $I_{out}$ flowing through the output resistor $R_{out}$ (an equivalent load resistor connected in the output terminal of the DAC) is adjusted, and an output voltage $V_{out}$ is generated. By decoding different digital data, the on and off states of current cells have different combinations, and consequently different output voltages ($V_{out}$) corresponding to digital data are generated via generating different output currents ($I_{out}$).

FIG. 2 is a schematic diagram of a current cell 20 depicted in FIG. 1, wherein IN1 and IN2 indicate two inverters. In FIG. 2, the source of the PMOS P0 is connected to a positive voltage $V_{DD}$, and the gate of PMOS P0 is biased by voltage $V_{bias}$, which turns on the PMOS P0. When the current cell 20 receives decoded signal "1" (DATA), the PMOS P1 is turned on, and current I flows from $V_{DD}$ through PMOS P0, and P1 to output terminal IO. Accordingly, output voltage $V_{out}$ appears when current I flows across the output load resistor.

For video DAC, two important specifications are current output compliance and voltage settling time. In FIG. 3, another general current cell 30 is illustrated. When $V_{DD}$ is 5 V, the current cell 30 has good current output compliance performance, that is, the output current of the current cell 30 is not subject to dramatic interference due to a rise of output voltage. Therefore, the current source can supply steady current and the current source behaves as a fixed current source, such that the analog output of the video DAC is more accurate. The PMOS P0 and P3 work in the saturation region, and the resistance of output resistor r0 and r3 is quite high, therefore, the equivalent output resistance at terminal IO equal to r0 in series with r3 is high enough such that the output current of the current source is not subject to variation due to the variation of the output voltage.

To conserve power consumption and achieve fast operation for VLSI, the operating voltage is reduced from 5 V to 3.3 V or even lower. This degrades the current output compliance and operation speed performance for a current source.

In FIG. 3, provided the absolute values $|V_{th}|$ of the threshold voltages of PMOS P0 and P3 are about 0.8 V, the power source $V_{DD}$ is 3.3 V. To keep PMOS P0 turned-on, $V_{bias}$ can not exceed 2.5 V. If $V_{bias}$ is 2.5 V, then the voltage $V_{A1}$ at node A1 is about 2.7 V, while P0 is turned on. To keep PMOS P3 turned-on, $V_{bias2}$ can not exceed 1.9 V.

Accordingly, the current flows from $V_{DD}$ node through P0, P3, and P1 to output terminal IO. However, when the output voltage $V_{IO}$ at output terminal IO exceeds about 1.1 V, it is obvious that PMOS P3 will operate in a non-saturation region. The output resistor r3 is reduced, such that the output resistor at output terminal IO is also reduced. Consequently, the output current of the current cell 30 is reduced due to the rise of output voltage, resulting in serious deterioration of the current output compliance performance. In addition, the settling time for output voltage is also increased due to unstable current output.

In order to improve the current output compliance performance, voltages $V_{bias}$ and $V_{bias2}$ are raised, and thus voltage at node C1 is raised. The drain current is $I=K \times (W/L) \times (V_{gs}-V_{th})^2$, wherein K is a constant, and W and L are the width and length of the channel of PMOS, respectively. This increase of the voltage at C1 node will reduce the output current. To overcome the drawbacks, the areas of PMOS P0 and P3 are increased, that is, the value of W/L is increased, thereby increasing the output current. However, the parasitic capacitance at A1 and C1 nodes is increased, resulting in voltage coupling to C1 node due to voltage switching (DATA or DATAB is switched between "1" and "0") in the gates of P1 and P2. The output current is subject to switching noise and becomes unstable. In addition, the operating speed is degraded such that the settling time is increased.

SUMMARY OF THE INVENTION

Accordingly, the object of the present invention is to disclose a current source apparatus with bias switches, wherein all the MOS transistors operate in the saturation region, and therefore the output resistor of the apparatus is high enough in value to improve the current compliance performance. In addition, because the areas of the MOS transistors are not increased, and the parasitic capacitance of the MOS transistors is not large, therefore, the settling time and operating speed is improved.

In order to achieve the above objects, the current source apparatus with bias switches, which is applied to digital-to-analog converters, comprises: a pull-up PMOS transistor, whose source is coupled to a voltage source node, and whose gate is coupled to a bias node to turn on the pull-up transistor; a first PMOS transistor and a second PMOS transistor, wherein the sources of the first and second transistors are jointly coupled to the drain of the pull-up transistor, and the drains of the first and second transistors are coupled a first load and a second load respectively for transforming the output current into output voltage; and a first driver and a second driver are disposed between the voltage node and a reference node respectively, wherein the input terminals of the first and second drivers receive a first signal and a second signal respectively, and the output terminals of the first and second drivers are coupled to the first and second transistors respectively.

In addition, the first and second signals are complementary signals, and when the first signal is at logic "H", the first driver and the first transistor in the saturation region and supply current to the first load, and when the second signal is at logic "H", the second driver and the second transistor in the saturation region supply current to the second load.

BRIEF DESCRIPTION OF THE DRAWINGS

Other objects, features and advantages of the present invention will become apparent by way of the following detailed description of the preferred but non-limiting embodiment. The description is made with reference to the accompanying following drawings.

DETAILED DESCRIPTIONS OF THE INVENTION

Figure 1:
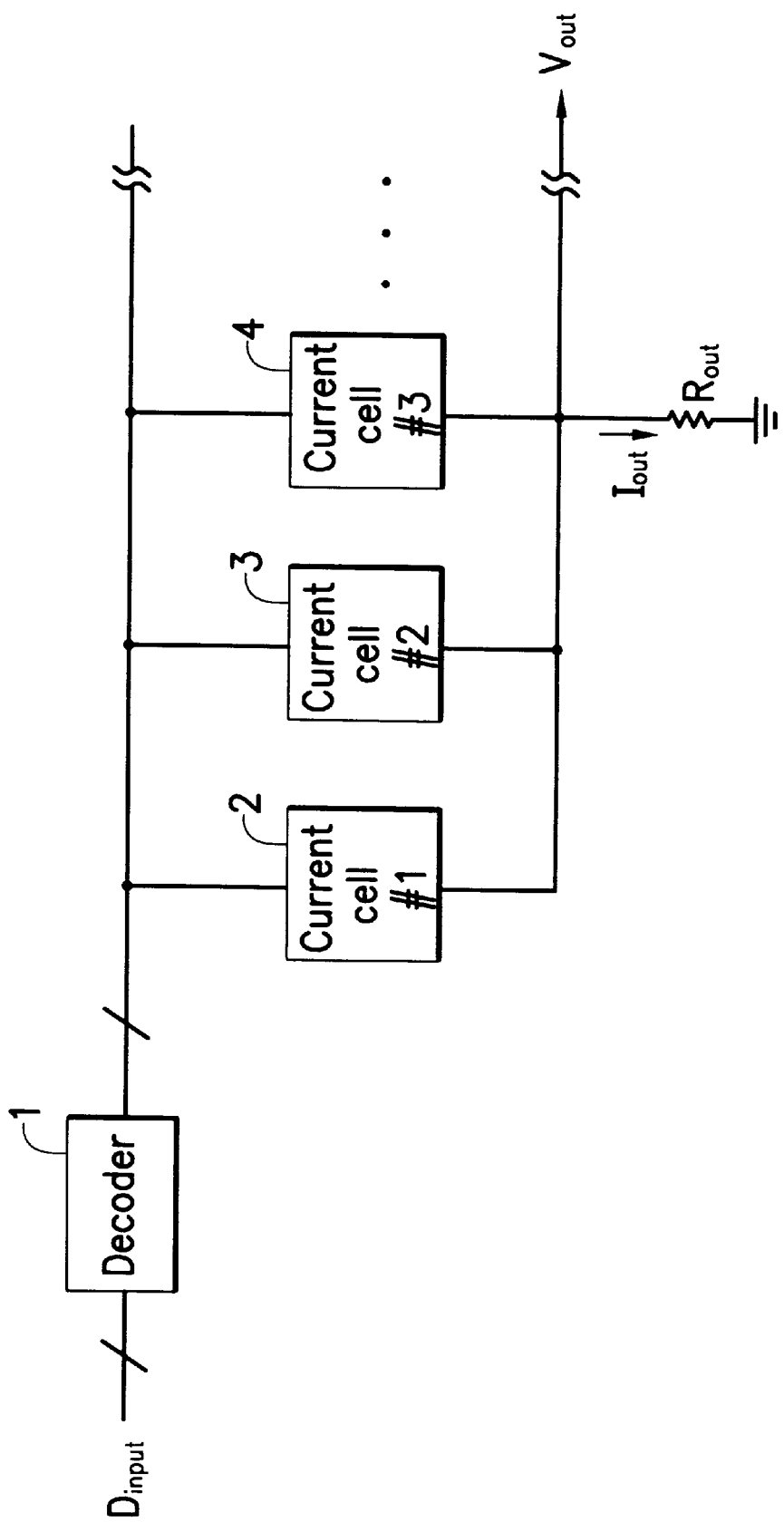
FIG. 1 is a block diagram of a digital-to-analog converter circuit.
Figure 2:
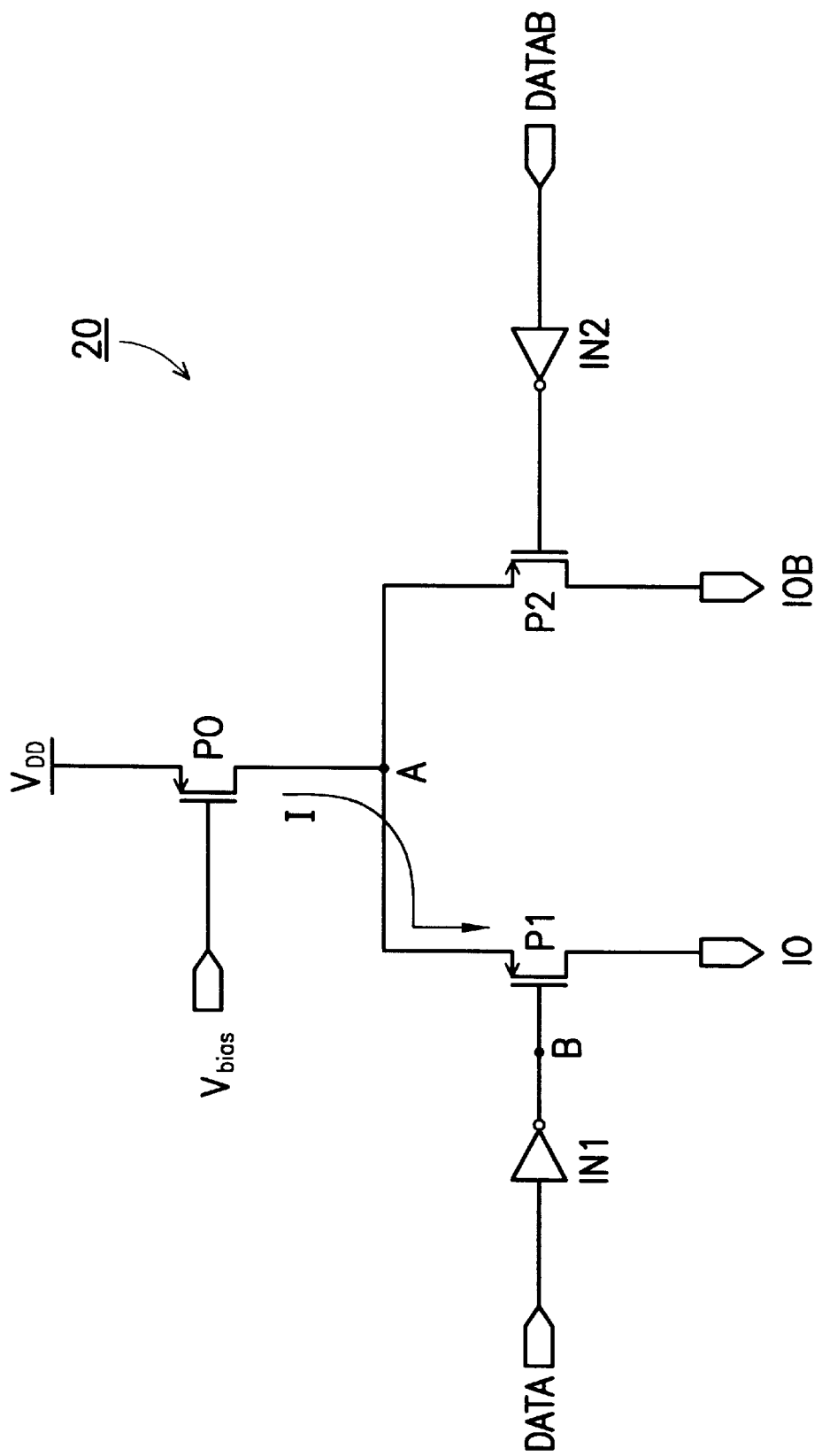
FIG. 2 illustrates a conventional current source applied in a digital-to-analog converter.
Figure 3:
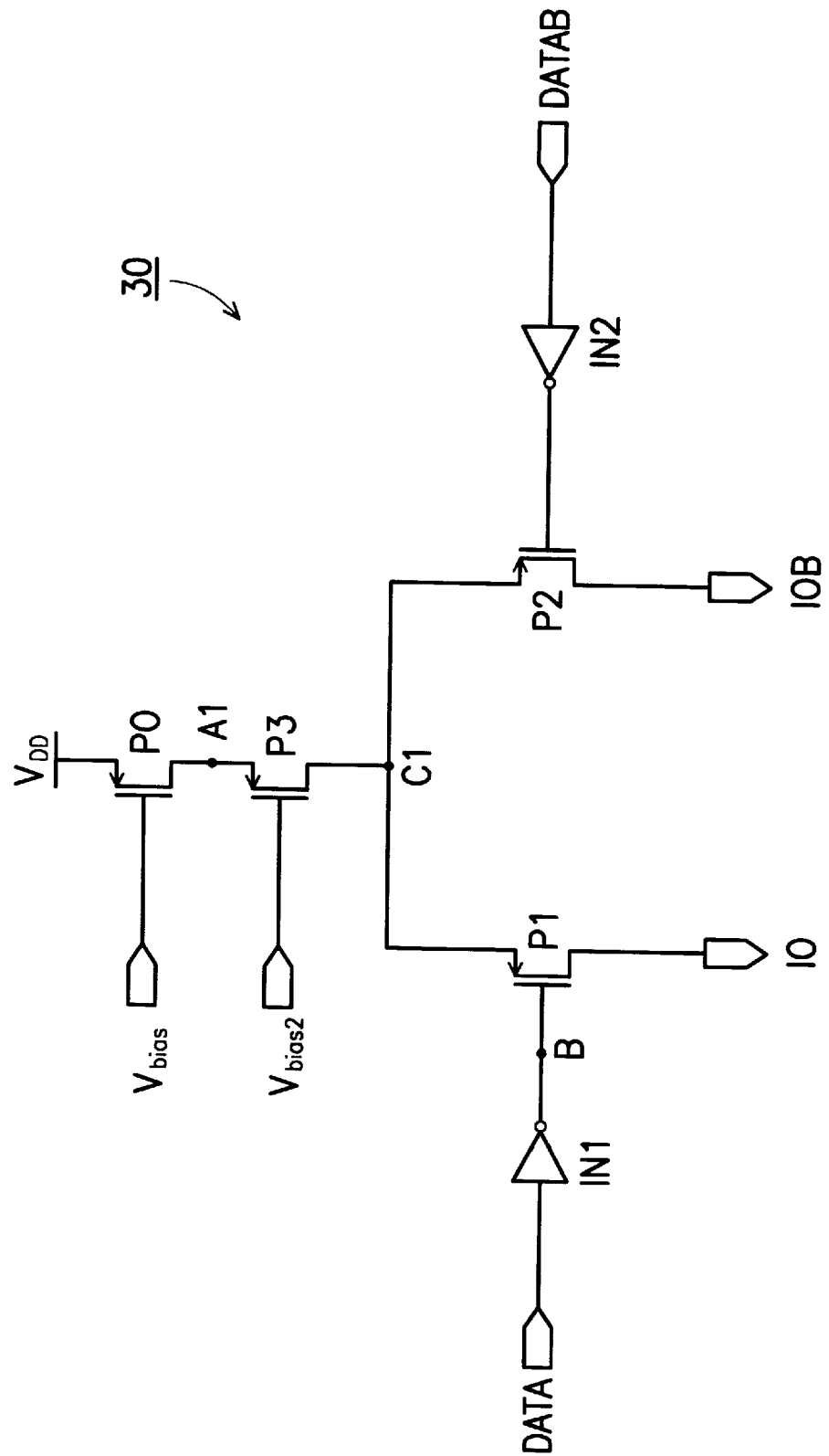
FIG. 3 illustrates another conventional current source applied in a digital-to-analog converter.

The current source apparatus with bias switches according to the present invention will be described via a preferred embodiment with reference to FIG. 4.

The current source apparatus in this embodiment mainly applied in digital-to-analog converters, comprises a pull-up PMOS transistor P0, a first and second transistor P1, p2, and a first and second drivers 41, 42. The connection of the above devices will be described hereinafter respectively, with reference to FIG. 4.

The source of the pull-up PMOS transistor P0 is coupled to a voltage source node $V_{DD}$, and its gate is coupled to a bias node $V_{bias}$ to keep the pull-up transistor P0 on state.

Both sovice of the first PMOS transistor P1 and second PMOS transistor P2 are jointly coupled to the drain of the pull-up transistor P0, and the drains of the first and second transistors P1, P2 are coupled a first resistor R1 and a second resistor R2 respectively for transforming the drain output current into output voltage.

The first driver 41 comprises a first NOMS transistor N1 and a second transistor N2 connected in series and disposed between the voltage source node $V_{DD}$ and the reference ground node, wherein both gates of the first and second NMOS transistors N1, N2 are coupled to the first signal DATA, and the connected node C of the first and second NMOS transistors N1, N2 are coupled to the gate of the first PMOS transistor P1. Further, the first driver 41 comprises a third NMOS transistor N3 disposed between the voltage source node $V_{DD}$ and the connected node C, wherein the second signal DATAB is coupled to the gate of the third NMOS transistor.

The second driver 42 comprises a fourth NOMS transistor N4 and a fifth transistor N5 connected in series and disposed between the voltage source node $V_{DD}$ and the reference ground node, wherein both gates of the fourth and fifth NMOS transistors N4, N5 are coupled to the second signal DATAB, and the connected node D of the fourth and fifth NMOS transistors N4, N5 are coupled to the gate of the second PMOS transistor P2. Further, the second driver 42 comprises a sixth NMOS transistor N6 disposed between the voltage source node $V_{DD}$ and the connected node D, wherein the first signal DATA is coupled to the gate of the sixth NMOS transistor.

It should be noted that the first and second signals (DATA and DATAB) are complementary signals, that is, when the first signal DATA is at logic "H", the second signal DATAB is at logic "L". Conversely, when the first signal DATA is at logic "L", the second signal DATAB is at logic "H".

When the first signal DATA is at logic "H", the first driver 41 drives the first PMOS transistor P1 and makes it operate in the saturation region, and the output current flows from voltage source node $V_{DD}$ through the pull-up transistor P0, first PMOS transistor P1 for supplying output current to the first resistor R1, thereby generating an analog output voltage corresponding to the input digital data. Similarly, when the second signal DATAB is at logic "H", the second driver 42 drives the second PMOS transistor P2 and makes it operate in the saturation region, and the output current flows from a voltage source node $V_{DD}$ through the pull-up transistor P0, second PMOS transistor P2 for supplying output current to the first resistor R2, thereby generating an analog output voltage corresponding to input digital data.

In this embodiment, the voltage at $V_{DD}$ node is 3.3 V, the dimensions of the first (fourth) NMOS transistor N1 (N4) and the second (fifth) NMOS transistor N2 (N5) in the first (or the second) driver 41 (42) are well adjusted for varying the turn-on resistance ratios of the first NMOS transistor N1 (N4) to the second (fifth) NMOS transistor N2 (N5) such that the output voltage of the first driver 41 (or the second driver 42) at terminal C (D) is about 0.7 V. Therefore, even if the output voltage at output terminal IO (or IOB) exceeds 1.2 V, the first PMOS transistor P1 (or second PMOS transistor P2) operates in the saturation region. Because of the high output resistance, the current source apparatus has better output compliance performance.

The absolute value of the difference between the output voltage of the first driver 41 (or the second driver 42) and the voltage at the drain of the first PMOS transistor P1 (the second PMOS P2) does not exceed the absolute value of the threshold voltage of PMOS P1 (PMOS P2), ensuring that the first PMOS transistor P1 (the second PMOS transistor P2) operate in the saturation region.

Figure 4:
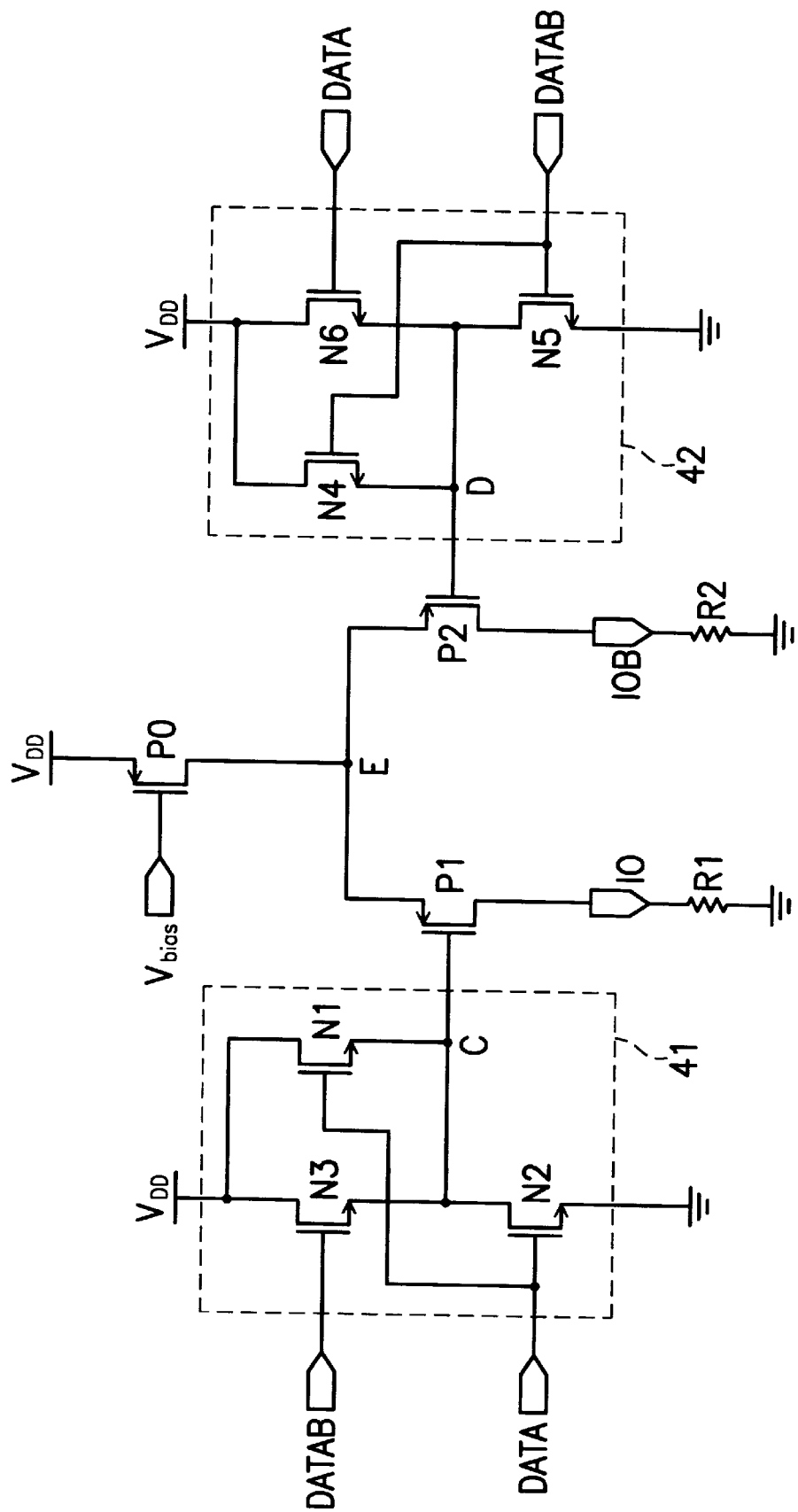
FIG. 4 illustrates a current source apparatus with bias switches applied in a digital-to-analog converter, according to the present invention.

In addition, the current source apparatus in FIG. 4 does not increase the dimensions of the MOS transistors to improve the output current compliance, and the operating speed is not subject to the interference due to the large capacitance. The switching voltages at terminals C and D are between 0.7 V and 2 V, which are less than the range of between 0 V and 3.3 V in the conventional art. Because the switching range is reduced, the interference at terminal E due to coupling voltage from terminals C and D is also reduced.

While the invention has been described in terms of what is presently considered to be three most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A current source apparatus with bias switches, applied in a digital-to-analog converter, comprising:

a pull-up PMOS transistor, the source of which is coupled to a voltage source node, and the gate of which is coupled to a bias node to turn on said pull-up transistor;

a first PMOS transistor and a second PMOS transistor, wherein the sources of said first and second transistors are jointly coupled to the drain of said pull-up transistor, and the drains of said first and second transistors are coupled to a first load and a second load respectively for transforming the output current outputted from said current source apparatus into output voltage; and a first driver and a second driver disposed between said voltage node and a reference node respectively, wherein the input terminals of said first and second drivers receive a first signal and a second signal respectively, and the output terminals of said first and second drivers are coupled to said first and second transistors respectively, said first driver comprising a first NMOS transistor and a second NMOS transistor, connected in series and disposed between said voltage source node and said reference node, wherein both gates of said first and second NMOS transistors are coupled to said first signal, and the connected node of said first and second NMOS transistors are coupled to the gate of said first PMOS transistor, said first driver further comprising a third NMOS transistor disposed between said voltage source node and said connected node, wherein said second signal is coupled to the gate of said third NMOS transistor;

wherein said first and second signals are complementary signals, and when said first signal is at logic high level, said first driver causes said first transistor to operate in the saturation region and supply current to said first load, and when said second signal is at logic high level, said second driver causes said second transistor to operate in the saturation region and supply current to said second load.

2. The apparatus as claimed in claim 1, wherein said second driver comprises:

a fourth NMOS transistor and a fifth NMOS transistor, connected in series and disposed between said voltage source node and said reference node, wherein both gates of said fourth and fifth NMOS transistors are coupled to said second signal, and the connected node of said fourth and fifth NMOS transistors are coupled to the gate of said second PMOS transistor; and a sixth NMOS transistor disposed between said voltage source node and said connected node, wherein said first signal is coupled to the gate of said sixth NMOS transistor.

3. The apparatus as claimed in claim 1, wherein the dimensions of said first and second NMOS transistors in said first driver are adjusted to vary the turn-on resistance ratio of said first and second NMOS transistors such that the absolute value of the difference between the output voltage of said first driver and the output voltage at the drain of said first PMOS transistor is less than the absolute value of the threshold voltage of said first PMOS transistor to ensure that said first PMOS transistor operates in the saturation region, while said first signal is at logic high level.

4. The apparatus as claimed in claim 2, wherein the dimensions of said fourth and fifth NMOS transistors in said second driver are adjusted to vary the turn-on resistance ratio of said fourth and fifth NMOS transistors such that the absolute value of the difference between the output voltage of said second driver and the output voltage at the drain of said second PMOS transistor is less than the absolute value of the threshold voltage of said second PMOS transistor, to ensure that said second PMOS transistor to operate in the saturation region, while said second signal is at logic high level.

5. The apparatus as claimed in claim 1, wherein said first and second loads are resistors.

6. A current source apparatus with bias switches, applied in a digital-to-analog converter, comprising:

a pull-up PMOS transistor, the source of which is coupled to a voltage source node, and the gate of which is coupled to a bias node to turn on said pull-up transistor;

a first PMOS transistor and a second PMOS transistor, wherein the sources of said first and second transistors are jointly coupled to the drain of said pull-up transistor, and the drains of said first and second transistors are coupled to a first load and a second load respectively for transforming the output current outputted from said current source apparatus into output voltage; and a first driver and a second driver disposed between said voltage node and a reference node respectively, wherein the input terminals of said first and second drivers receive a first signal and a second signal respectively, and the output terminals of said first and second drivers are coupled to said first and second transistors respectively, said second driver comprising a fourth NMOS transistor and a fifth NMOS transistor, connected in series and disposed between said voltage source node and said reference node, wherein both gates of said fourth and fifth NMOS transistors are coupled to said second signal, and the connected node of said fourth and fifth NMOS transistors are coupled to the gate of said second PMOS transistor, said second driver further comprising a sixth NMOS transistor disposed between said voltage source node and said connected node, wherein said first signal is coupled to the gate of said sixth NMOS transistor;

wherein said first and second signals are complementary signals, and when said first signal is at logic high level, said first driver causes said first transistor to operate in the saturation region and supply current to said first load, and when said second signal is at logic high level, said second driver causes said second transistor to operate in the saturation region and supply current to said second load.

7. The apparatus of claim 6, wherein said first driver comprises a first NMOS transistor and a second NMOS transistor, connected in series and disposed between said voltage source node and said reference node, wherein both gates of said first and second NMOS transistors are coupled to said first signal, and the connected node of said first and second NMOS transistors are coupled to the gate of said first PMOS transistor, said first driver further comprising a third NMOS transistor disposed between said voltage source node and said connected node, wherein said second signal is coupled to the gate of said third NMOS transistor.

8. The apparatus as claimed in claim 7, wherein the dimensions of said first and second NMOS transistors in said first driver are adjusted to vary the turn-on resistance ratio of said first and second NMOS transistors such that the absolute value of the difference between the output voltage of said first driver and the output voltage at the drain of said first PMOS transistor is less than the absolute value of the threshold voltage of said first PMOS transistor to ensure that said first PMOS transistor operates in the saturation region, while said first signal is at logic high level.

9. The apparatus as claimed in claim 6, wherein the dimensions of said fourth and fifth NMOS transistors in said second driver are adjusted to vary the turn-on resistance ratio of said fourth and fifth NMOS transistors such that the absolute value of the difference between the output voltage of said second river and the output voltage at the drain of said second PMOS transistor is less than the absolute value of the threshold voltage of said second PMOS transistor, to ensure that said second PMOS transistor to operate in the saturation region, while said second signal is at logic high level.

10. The apparatus as claimed in claim 6, wherein said first and second loads are resistors.

* * * * *